(12) United States Patent
Ty Tan et al.

(10) Patent No.: US 8,044,381 B2
(45) Date of Patent: Oct. 25, 2011

(54) LIGHT EMITTING DIODE (LED)

(75) Inventors: Michael Renne Ty Tan, Menlo Park, CA (US); Shih-Yuan Wang, Palo Alto, CA (US); Alexandre M. Bratkovski, Mountain View, CA (US); David A. Fattal, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 641 days.

(21) Appl. No.: 11/830,601

(22) Filed: Jul. 30, 2007

(65) Prior Publication Data

US 2009/0032798 A1    Feb. 5, 2009

(51) Int. Cl.
*H01L 29/06* (2006.01)
*H01L 31/072* (2006.01)
*H01L 31/0336* (2006.01)
*H01L 31/0328* (2006.01)

(52) U.S. Cl. ....... 257/13; 257/14; 257/79; 257/E21.001; 257/E33.008; 257/E33.001; 438/22; 438/39; 438/44; 438/46

(58) Field of Classification Search .................. None
See application file for complete search history.

(56) References Cited

U.S. PATENT DOCUMENTS

| | | | |
|---|---|---|---|
| 5,077,752 A | 12/1991 | Tada et al. | |
| 5,294,833 A | 3/1994 | Schetzina | |
| 5,319,657 A | 6/1994 | Otsuka et al. | |
| 5,777,350 A | 7/1998 | Nakamura et al. | |
| 5,779,924 A | 7/1998 | Krames et al. | |
| 6,046,464 A | 4/2000 | Schetzina | |
| 6,153,894 A | 11/2000 | Udagawa | |
| 6,277,665 B1 * | 8/2001 | Ma et al. | 438/46 |
| 6,291,257 B1 * | 9/2001 | Kadota | 438/46 |
| 6,376,864 B1 * | 4/2002 | Wang | 257/98 |
| 6,400,452 B1 | 6/2002 | Maynard | |
| 6,452,206 B1 * | 9/2002 | Harman et al. | 257/22 |
| 6,542,526 B1 * | 4/2003 | Niwa et al. | 372/45.01 |
| 6,897,489 B1 | 5/2005 | Peng et al. | |
| 7,142,788 B2 | 11/2006 | Price | |
| 7,187,007 B2 * | 3/2007 | Kim et al. | 257/79 |
| 7,271,417 B2 | 9/2007 | Chen | |
| 7,541,206 B2 * | 6/2009 | Yoon et al. | 438/29 |
| 7,606,492 B2 | 10/2009 | Farmer et al. | |
| 7,705,348 B2 * | 4/2010 | Wang et al. | 257/44 |

(Continued)

FOREIGN PATENT DOCUMENTS

JP    2001-102629 A    4/2001

OTHER PUBLICATIONS

Marui et al., JP2001-102629A Abstract, <http://www.ipdl.inpit.go.jp/homepg_e.ipdl>, Sep. 28, 2010, (Machine Translation).

*Primary Examiner* — Zandra Smith
*Assistant Examiner* — Khanh Duong

(57) ABSTRACT

A light-emitting diode (LED) includes a p-type layer, an n-type layer, and an active layer arranged between the p-type layer and the n-type layer. The active layer includes at least one quantum well adjacent to at least one modulation-doped layer. Alternatively, or in addition thereto, at least one surface of the n-type layer or the p-type layer is texturized to form a textured surface facing the active layer.

21 Claims, 6 Drawing Sheets

U.S. PATENT DOCUMENTS

| | | | |
|---|---|---|---|
| 7,777,241 B2 | 8/2010 | Moustakas et al. | |
| 2001/0038102 A1* | 11/2001 | Kawase | 257/98 |
| 2003/0042479 A1* | 3/2003 | Tsuchiya | 257/14 |
| 2003/0214989 A1* | 11/2003 | Takase | 372/45 |
| 2004/0026710 A1 | 2/2004 | Tsuda et al. | |
| 2005/0242364 A1 | 11/2005 | Moustakas et al. | |
| 2006/0273333 A1* | 12/2006 | Wu et al. | 257/94 |
| 2008/0111146 A1 | 5/2008 | Nakamura et al. | |
| 2008/0279567 A1 | 11/2008 | Huang et al. | |
| 2009/0159907 A1 | 6/2009 | Wang | |

* cited by examiner

LIGHT EMITTING DIODE (LED)

BACKGROUND

Light emitting diodes (LEDs) have found utility in a variety of applications from common light sources, such as flashlights and automotive headlights, to photonic interconnects for data transmission. An LED is a semiconductor device that spontaneously emits a narrow spectrum of light when electrically biased in the forward direction of a p-n junction. Light is created in, and released from, the p-n junction, which is more commonly referred to as the active layer.

LEDs generally include an n-type substrate with an active layer, a p-type layer, and an electrode attached to the p-type layer deposited on its surface. Current LEDs often utilize a double heterostructure, which includes an n-type contact layer, an n-type clad layer, an active layer, a p-type clad layer, and a p-type contact layer superimposed on a substrate. The use of double heterostructure LEDs provides increased efficiency by better confining carriers in the active layer.

The active layer of an LED is commonly doped with a donor impurity such as Si or Ge and/or an acceptor impurity such as Mn or Mg. Doping increases the emission power of the active layer, because more carriers, such as electrons and holes, are provided in the active layer, but doping also has negative effects on the performance of the LED. For instance, doping increases carrier lifetime and, thus, reduces the speed of the LED. Therefore, because doping trades power for speed, doped LED's have limited utility in applications that require high modulation speed, such as photonic interconnects for the transmission of data.

Attempts to improve the speed of LEDs include the use of quantum well structures in the active layer. A quantum well confines energy and increases light emission output when compared to conventional doped active layers due to the quantum size effect. However, conventional LEDs utilizing quantum wells do not provide sufficient power because they lack an adequate supply of carriers. As mentioned above, adding carriers, by doping for instance, reduces the speed of LEDs. Therefore, current LEDs are limited by either speed or power.

An additional drawback of conventional LEDs is that they are also hampered by poor efficiency. Efficiency is a two-fold problem. First, light production efficiency refers to the generation of light in the active layer. LEDs having doped active regions produce light slowly, while LEDs utilizing quantum wells produce light more quickly, but at less power, as mentioned above. Second, extraction efficiency refers to the amount of light extracted from the active layer after the light is generated and the speed at which the light is extracted. Extraction efficiency is a problem with all conventional LEDs because the semiconductor layer adjacent to the active layer reflects the light back into the active layer. Thus, the lack of overall efficiency of conventional LEDs practically limits their use in high speed applications, such as photonic interconnects.

BRIEF DESCRIPTION OF THE DRAWINGS

Features of the present invention will become apparent to those skilled in the art from the following description with reference to the figures, in which.

DETAILED DESCRIPTION

Figure 1A:
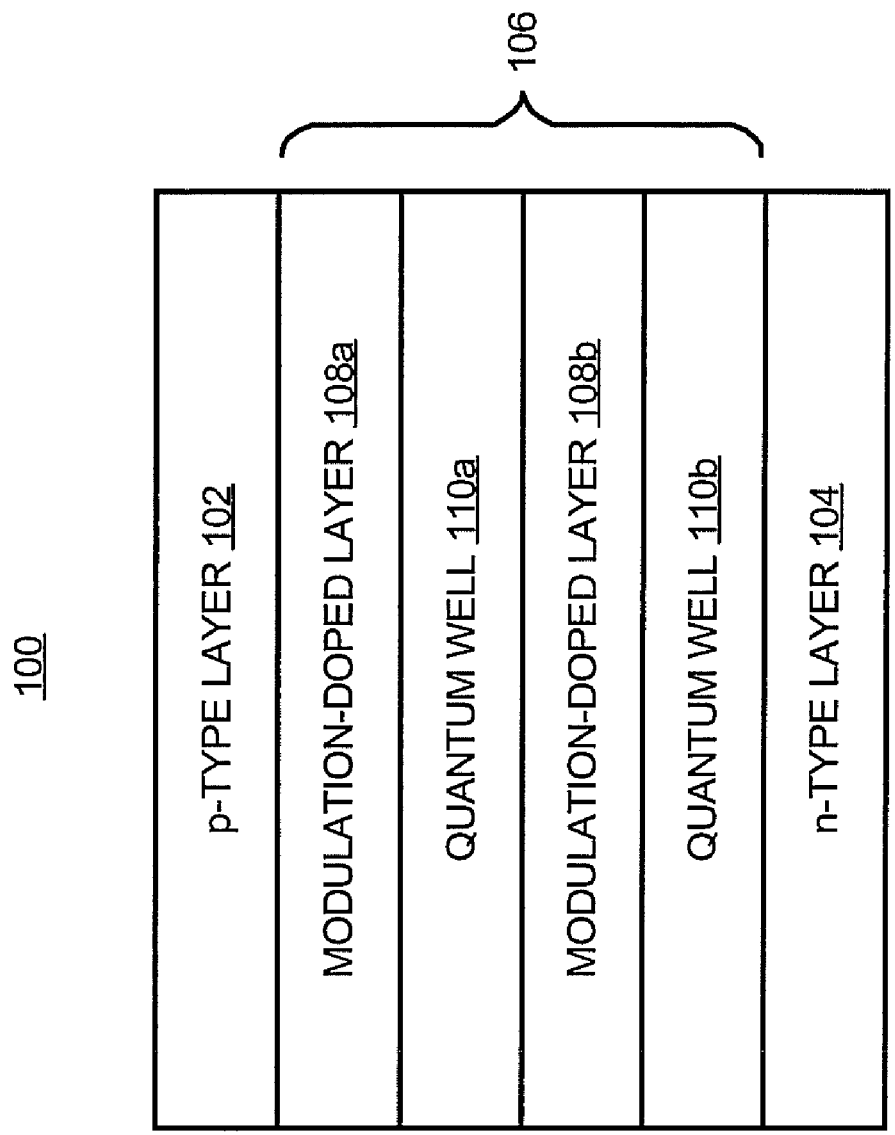
FIG. 1A illustrates a structure comprising an active layer having alternating quantum wells and modulation-doped layers, according to an embodiment.

For simplicity and illustrative purposes, the present invention is described by referring mainly to exemplary embodiments. In the following description, numerous specific details are set forth in order to provide a thorough understanding of the embodiments. It will be apparent however, to one of ordinary skill in the art, that the examples may be practiced without limitation to these specific details. In other instances, well known methods and structures have not been described in detail so as not to unnecessarily obscure the examples.

Embodiments of structures that are configured to emit light, and methods for fabricating the structures are disclosed herein. The structures include an active layer provided between a p-type layer and an n-type layer. The structures may be used for an LED. As mentioned above, an LED is a semiconductor device that spontaneously emits light when electrically biased in the forward direction of the active layer. The emission of light is spontaneous because photons are released as soon as carriers, such as electrons and holes, move through the active layer. That is, photons are emitted spontaneously to produce light when carriers enter the active layer. Thus, LEDs are distinguished from other forms of light producing devices, such as lasers, which, by definition, require stimulation to emit light. For instance, a laser requires a gain medium to stimulate the emission of light by transmitting a wavelength of light repeatedly through the gain medium. Therefore, lasers require devices not found in LEDs, such as feedback systems to repeatedly redirect the wavelength of light through the gain medium. Moreover, LEDs often utilize elements not found in other forms of light-producing devices, such as lasers. For instance, LEDs commonly utilize a metal electrode having an opening through the metal electrode to allow light spontaneously generated in the active layer to escape through the opening.

The structures described herein may include a double heterostructure having multiple p-type layers and multiple n-type layers on either side of the active layer. According to an embodiment, a surface of one or more of the n-type layers and/or one or more of the p-type layers may be textured. Surfaces are textured by texturizing, which refers to the process of altering the surface of a layer from a substantially smooth or flat surface to a substantially non-flat surface. Textured surfaces may be substantially uniform having a regular repeating pattern or may be random and irregular, as will be described in greater detail below. The textured surface of one or more of the p- or n-type layers may be facing the active layer and, in other examples, may also be directly adjacent to the active layer.

According to another embodiment, the active layer of the structures include at least one quantum well and at least one modulation-doped layer arranged in an adjacent and/or alternating relationship. A modulation-doped layer refers to a layer which has been modulation or pulsed doped such that the doping is applied in thin, narrow bands. For example, an active layer may include a modulation-doped layer adjacent to a quantum well or a quantum well sandwiched between two modulation-doped layers or vice-versa. In other example, the active layer may include two or more quantum wells and two or more modulation-doped layers, which are arranged in an alternating relationship, that is quantum well, modulation-doped layer, quantum well, modulation-doped layer, etc., as will be described in greater detail below. The modulation-doped layers may include any p- or n-type impurities, as is known in the art.

The textured surfaces and the active layers described above may be utilized separately, or in conjunction with each other, to increase the efficiency of an LED. That is, the emission output of an LED may be improved with the examples described herein. For instance, the textured surface facing the active layer may increase extraction efficiency by reducing the internal reflection of the layer having the textured surface, thereby allowing light generated in the active layer to escape more efficiently.

Similarly, an active layer having quantum wells and modulation-doped layers arranged in an alternating relationship also increases the light production efficiency of an LED. This is because the modulation-doped layers provide a source of carriers within the active layer, but the doping is not present in the quantum wells where the light is produced. Therefore, the modulation-doped layers do not negatively affect the speed at which photons are released.

As such, the embodiments described herein allow for the creation of a much faster LED with a reduced quantum lifetime, as compared to conventional LEDs, without sacrificing quantum efficiency. For example, LEDs utilizing the structure and methods described herein may realize modulation speeds above 1 Gigabyte per second (GB/s). For instance, the structures and methods may result in LEDs having modulation speeds at and above 3 GB/s.

With respect to FIG. 1A, there is shown a structure 100 having an active layer 106 with alternating quantum wells 110a and 110b and modulation-doped layers 108a and 108b, according to an embodiment. It should be understood that the following description of the structure 100 is but one manner of a variety of different manners in which such a structure 100 may be configured. In addition, it should be understood that the structure 100 may include additional layers and devices not shown in FIG. 1A and that some of the layers described herein may be removed and/or modified without departing from a scope of the structure 100.

The active layer 106 of the structure 100 is provided between a p-type layer 102 and an n-type layer 104. As such, the structure 100 may be used in an LED and, thus, may comprise additional layers, such as cladding layers (not shown), commonly found in LEDs. For example, the p-type layer 102 and the n-type layers 104 may each include a plurality of layers to form a double heterostructure, as is known in the art. The structure 100 may also include any reasonably suitable substrates, electrodes, outer coverings, etc., which are commonly found in LEDs.

The p-type layer 102 and the n-type layer 104 may comprise any materials known in the art, such as GaN, AlGaN, ZnO, HgSe, ZnTeSe, ZnHgSe, ZnSe, AlGaAs, AlGaP, AlGaInP, GaAsP, GaP, InGaN, SiC, AlN etc. Moreover, although the p-type layer 102 and the n-type layer 104 are illustrated as single layers, respectively, a person having ordinary skill in the art will appreciate that the p-type layer 102 and the n-type layer 104 may each comprise more than one layer, as set forth above.

The active layer 106 is illustrated as including two modulation-doped layers 108a and 108b and two quantum wells 110a and 110b. However, the active layer 106 may include any reasonably suitable number of modulation-doped layers and 108b and quantum wells 110a and 110b. For example, the active layer 106 may include only one modulation-doped layer 108a and only one quantum well 110a, two modulation-doped layers 108a and 108b and one quantum well 110a, two quantum wells 110a and 110b and one modulation-doped layer 108a, more than two modulation-doped layers 108a and 108b, and more than two quantum wells 110a and 110b. Moreover, the modulation-doped layers 108a and 108b and the quantum wells 110a and 110b may be arranged in any order or configuration. For instance, either a modulation-doped layer 108a or a quantum well 110a may be positioned adjacent to the p-type layer 102 or the n-type layer 104. The modulation-doped layers 108a and 108b may include any known p-type or n-type doping material.

In an embodiment, the modulation-doped layers 108a and 108b and the quantum wells 110a and 110b may be arranged adjacent to each other when the active layer 106 includes only a single modulation-doped layer 108a and a single quantum well 110a or arranged in an alternating configuration, as shown in FIG. 1A. That is, the active layer 106 may be configured such that the modulation-doped layer 108a is adjacent to the quantum well 110a, while the opposite surface of the quantum well 110a is adjacent to another modulation-doped layer 108b and the opposite surface of the modulation-doped layer 108b is adjacent to another quantum well 110b, etc. In this manner, light may be generated inside the quantum wells 110a and 110b unimpeded by the deleterious effects of doping impurities. Yet the quantum wells 110a and 110b are provided with a sufficient source of carriers by virtue of their proximity to the modulation-doped layers 108a and 108b.

Figure 1B:
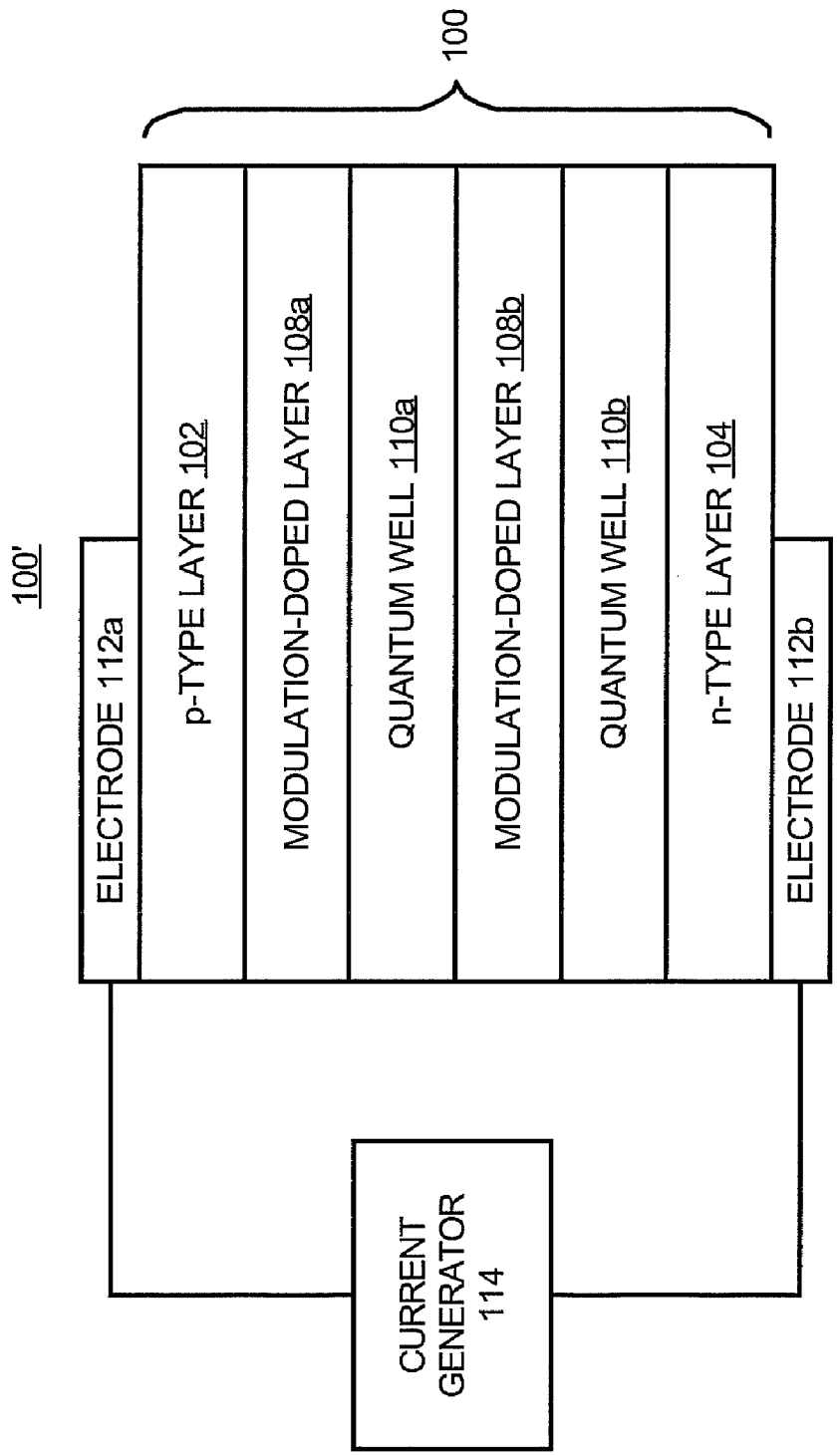
FIG. 1B illustrates a structure comprising an active layer having alternating quantum wells and modulation-doped layers and electrodes, according to an embodiment.

With respect to FIG. 1B, there is shown a structure 100', which includes the structure 100, shown in FIG. 1A with additional components used to generate light, according to an embodiment. It should be understood that the following description of the structure 100' is but one manner of a variety of different manners in which such a structure 100' may be configured. In addition, it should be understood that the structure 100' may include additional layers and devices not shown in FIG. 1B and that some of the layers described herein may be removed and/or modified without departing from a scope of the structure 100'.

In FIG. 1B, the structure 100 is shown having two electrodes 112a and 112b in contact with the p-type layer 102 and the n-type layer 104, respectively. The electrodes 112a and 112b are connected to a current generator 114, which provides an electric current to the electrodes 112a and 112b and, thus, to the structure 100. As such, the structure 100' may be used as an LED, because the current generator 114 may provide an electric current, which stimulates carriers to move into the active layer 106. It should be understood that the electrodes 112a and/or 112b may have openings therethrough to allow for the emission of light from the structure 100'. A person having ordinary skill in the art will also appreciate that the electrodes 112a and 112b may have different shapes, sizes, lengths, etc. than pictured in FIG. 1B and may be positioned on different layers of the structure 100.

Figure 2:
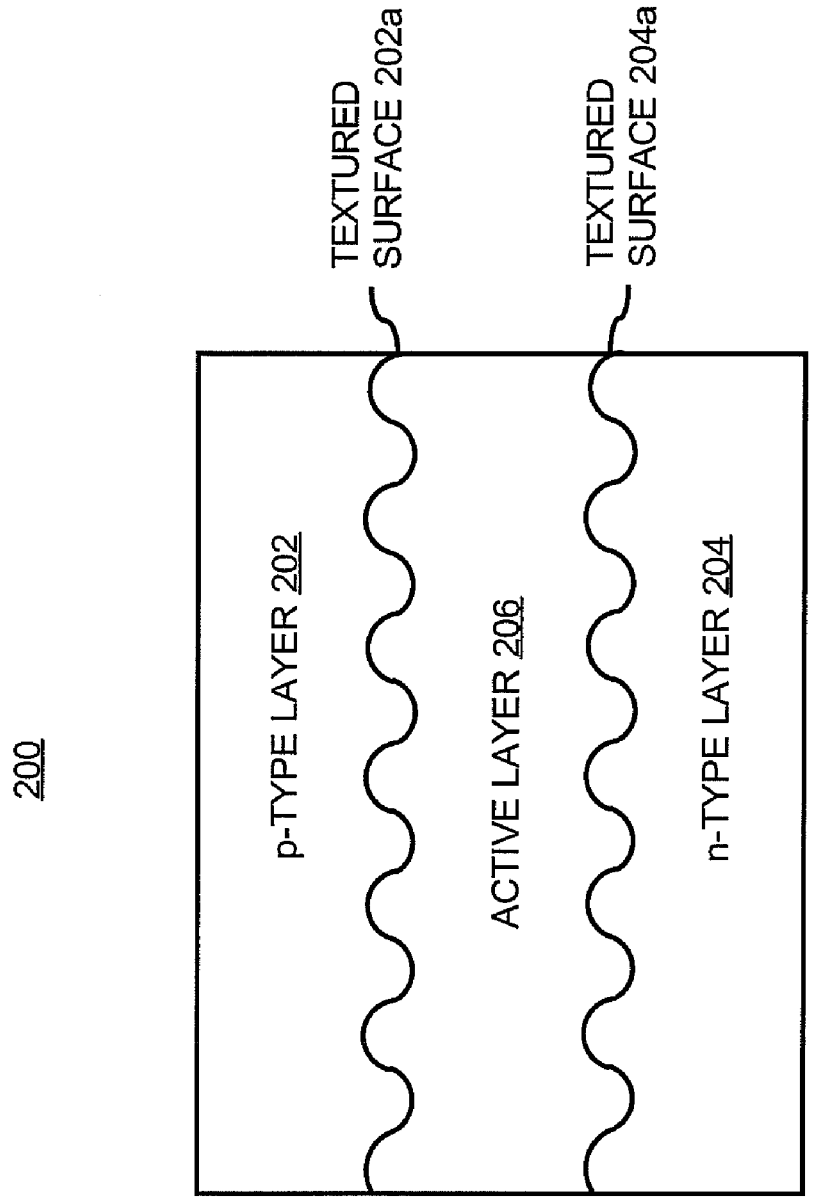
FIG. 2 illustrates a structure comprising a textured surface facing an active layer, according to an embodiment.

With respect to FIG. 2, there is shown a cross-sectional view of a structure 200 having textured surfaces 202a and 204a facing an active layer 206, according to an embodiment. It should be understood that the following description of the structure 200 is but one manner of a variety of different manners in which such a structure 200 may be configured. In addition, it should be understood that the structure 200 may include additional layers and devices not shown in FIG. 2 and that some of the layers described herein may be removed and/or modified without departing from a scope of the structure 200.

The structure 200 includes a p-type layer 202 and an n-type layer 204, which may be substantially similar to the p-type layer 102 and the n-type layer 104 described above, with respect to FIG. 1A. For example, the p-type layer 202 and the n-type layer 204 may comprise more than one layer, respectively, to form a double heterostructure. The structure 200 also includes an active layer 206, which may be configured to allow carriers to flow therein to produce light. Therefore, the structure 200 may also be used in an LED to spontaneously produce light. As such, the structure 200 may include additional layers and devices (not shown), which are commonly found in LEDs.

The active layer 206 of the structure 200 may comprise any material used in LEDs, such as quantum wells, multi-quantum wells, doped materials, etc. The active layer 206 may be a single modulation-doped layer or quantum well, or may be substantially similar to the active layer 106 described above with respect to FIG. 1A, which is also described in greater detail with respect to FIG. 3 below.

The p-type layer 202 and the n-type layer 204 are illustrated in FIG. 2 as having textured surfaces 202a and 204a, respectively, facing the active layer 206. That is, the p-type layer 202 and the n-type layer 204 each have at least two surfaces, one of which faces the active layer 206 and the other of which faces the opposite direction away from the active layer 206. In the structure 200, the surface of the p-type layer 202 and the n-type layer 204 facing the active layer 206 have textured surfaces 202a and 204a. Textured surfaces 202a and 204a refer to surfaces, which are substantially non-flat. The textured surfaces 202a and 204a are depicted as corrugated in a regular repeating pattern. However, the textured surfaces 202a and 204a may be corrugated in any irregular or random pattern. Moreover, the textured surfaces 202a and 204a need not be corrugated, but may be jagged and, roughened, patterned, or etched in any regular, irregular, or random pattern. In fact, the texturization may be affected by the angular distribution of the light emission incident at the interface of the active layer and the adjacent semiconductor layer, as well as the shape of this interface. As such, the textured surfaces 202a and 204a may be optimized for maximum light extraction efficiency depending on the type and shape of the various layers used to form the structure 200.

Although FIG. 2 depicts surfaces of both the p-type layer 202 and the n-type layer 204 as being textured, a person having ordinary skill in the art will appreciate that the structure 200 may include only one textured surface 204a. For example, a surface of either the n-type layer 204 or the p-type layer 202 may be texturized by a nanoimprinting process without texturizing any other surfaces. In another embodiment, one of the layers may be texturized and the other layers may be grown on the textured surface 204a of the texturized layer. This process may inherently result in the formation of two texturized surfaces, as described below with respect to FIG. 4.

As set forth above, providing textured surfaces 202a and 204a facing the active layer 206 increases the efficiency of light extraction from the active layer 206. For instance, the textured surfaces 202a and 204a may reduce lifetime. This is because light generated in the active layer 206 is trapped inside the active layer 206 due to the refractive index of the adjacent semiconductor layers, such as the p-type layer 202 and the n-type layer 204. Therefore, the light generated in the active layer 206 reflects off the surfaces of the adjacent semiconductor layers and back into the active layer 206. The textured surfaces 202a and 204a facing the active layer 206 randomize the direction of light coming out of active region 206 as opposed to isotropic light emission. Thus, the textured surfaces 202a and 204a reduce total internal reflection and enhance the extraction efficiency of the light generated in the active layer 206.

Figure 3:
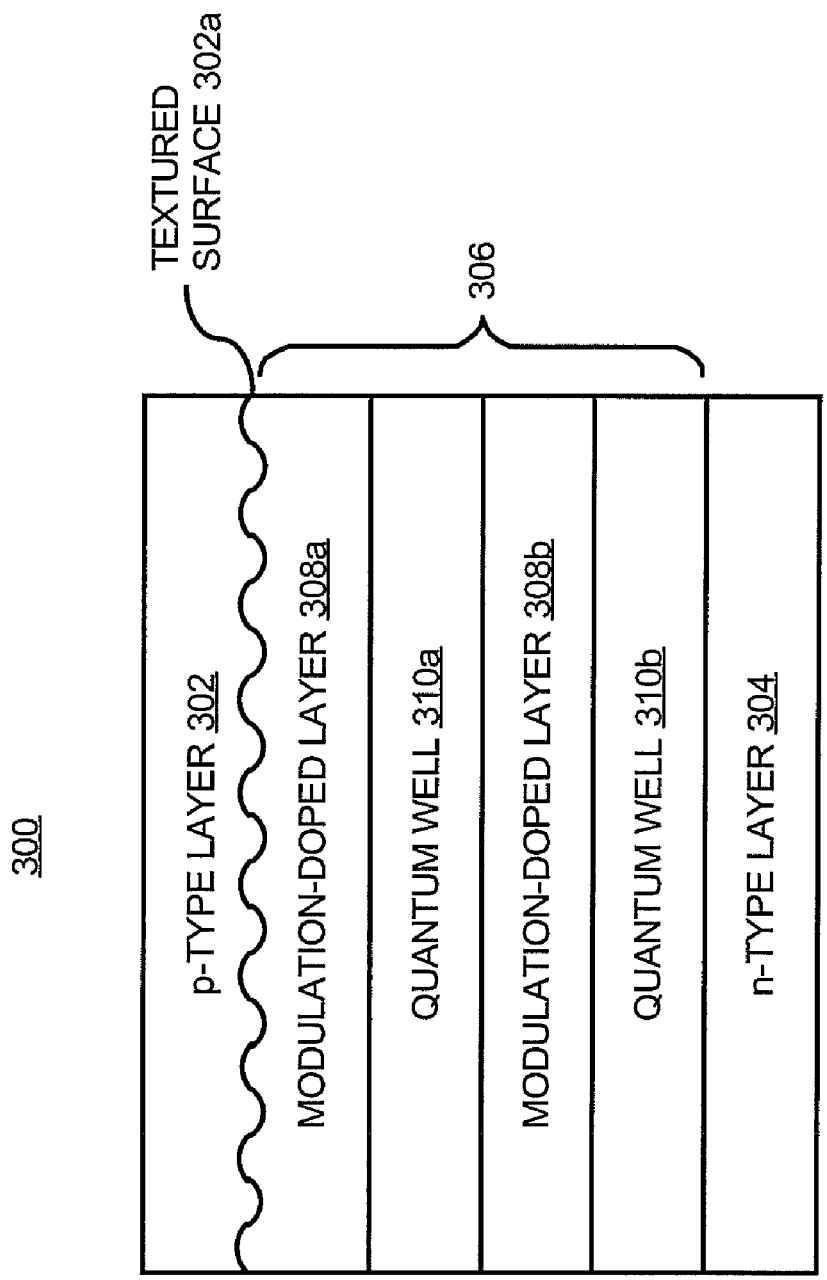
FIG. 3 illustrates a structure comprising an active layer having alternating quantum wells and modulation-doped layers and a textured surface facing the active layer, according to an embodiment.

With respect to FIG. 3, there is shown a structure 300 having an active layer 306 with alternating quantum wells 310a and 310b and modulation-doped layers 308a and 308b and a textured surface 302a facing the active layer 306. It should be understood that the following description of the structure 300 is but one manner of a variety of different manners in which such a structure 300 may be configured. In addition, it should be understood that the structure 300 may include additional layers and devices not shown in FIG. 3 and that some of the layers described herein may be removed and/or modified without departing from a scope of the structure 300.

The structure 300 includes a p-type layer 302 and an n-type layer 304, which may be substantially similar to the p-type layer 102 and the n-type layer 104 described above, with respect to FIG. 1A. For example, the p-type layer 302 and the n-type layer 304 may comprise more than one layer, respectively, to form a double heterostructure. The structure 300 includes the active layer 306 and, thus, the structure 300 may also be used in an LED to spontaneously produce light. As such, the structure 300 may include additional layers and devices (not shown), which are commonly found in LEDs.

The active layer 306 of the structure 300 is substantially similar to the active layer 106, described with respect to FIG. 1A. As such, the active layer 306 includes two modulation-doped layers 308a and 308b and two quantum wells 310a and 310b arranged in an alternating configuration. The textured surface 302a of the p-type layer 302 may be substantially similar to the textured surface 202a, described with respect to FIG. 2. Therefore, the structure 300 may include the active region 306 to provide enhanced light generation efficiency and the textured surface 302a to provide enhanced light extraction efficiency, thereby improving the overall efficiency and speed of an LED utilizing the structure 300.

Figure 4:
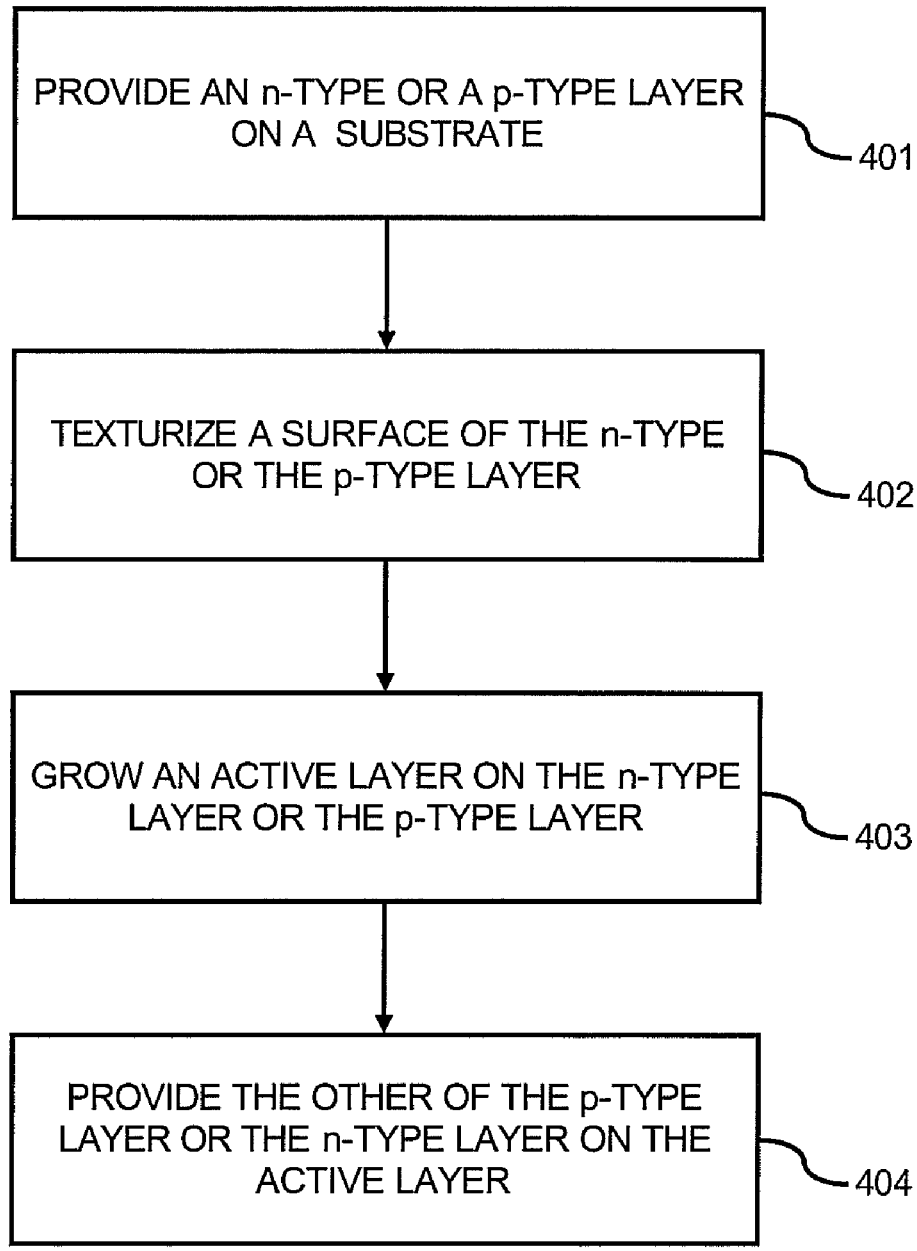
FIG. 4 illustrates a flow chart of a method for fabricating a structure comprising a textured surface facing an active layer, according to an embodiment.

Turning now to FIG. 4, there is shown a flow diagram of a method 400 for fabricating a structure having a textured surface facing an active layer, according to an embodiment. It is to be understood that the following description of the method 400 is but one manner of a variety of different manners in which an example of the invention may be practiced. It should also be apparent to those of ordinary skill in the art that the method 400 represents a generalized illustration and that other steps may be added or existing steps may be removed, modified or rearranged without departing from a scope of the method 400.

The description of the method 400 is made with reference to the structure 200 illustrated in FIG. 2 and thus makes reference to the elements cited therein. It should, however, be understood that the method 400 is not limited to the layers set forth in the structure 200. Instead, it should be understood that the method 400 may be used with a structure having a different configuration than the structure 200 set forth in FIG. 2.

The method 400 may be initiated at step 401 where either an n-type layer 204 or a p-type layer 202 is provided. For example, the n-type layer 204 or the p-type layer 202 may be grown or otherwise provided on a substrate using known growth techniques such as molecular beam epitaxy (MBE), metalorganic chemical vapor deposition (MOCVD), atomic layer epitaxy (ALE), etc. The substrate may be any material known in the art for forming LEDs, such as a semiconductor material, silicon carbide (SiC), Silicon (Si), Sapphire ($Al_2O_3$), etc. Similarly, the n-type layer 204 or the p-type layer 202 may comprise any reasonably suitable n-type or p-type semiconductor material known in the art.

At step 402, a surface of the n-type layer 204 or a p-type layer 202 layer is texturized to form a textured surface 204a. The surface of the n-type layer 204 or the p-type layer 202 may be texturized by any process known in the art including nanoimprinting, nanolithography, etc. to have any substantially non-flat profile. For example, the surface of the n-type layer 204 or the p-type layer 202 may be texturized in a random or regular corrugation pattern. The textured surface 204a may be optimized depending on the types of materials used to form the various layers of the structure 200 and the shapes of the layers, as set forth above.

At step 403, an active layer 206 is grown on the textured surface 204a of the n-type layer 204 or the p-type layer 202. The active layer 206 may be grown by any of the methods described above and may include one or more layers and one or more different types of materials. For example, the active layer 206 may include a plurality of modulation-doped layers and a plurality of quantum wells arranged in an alternating configuration. Because the active layer 206 is grown on the textured surface 204a of the n-type layer 204 or the p-type layer 202, the resulting structure comprises a textured layer 204a facing the active layer 206 and also, in this example, adjacent to the active layer 206.

At step 404, the other of the n-type layer 204 or the p-type layer 202 is provided on the active layer 206 by any method known in the art, including those described above. The phrase "the other of the n-type layer 204 or the p-type layer 202" refers to the layer, which was not used in step 401. That is, if the n-type layer 204 is used in step 401, then the p-type layer 202 is used here in step 404. In one example, the other of the n-type layer 204 or the p-type layer 202 may inherently have a textured surface 202a facing, and adjacent to, the active layer 206. This occurs when the opposite surface of the active layer 206 from the n-type layer 204 or the p-type layer 202 is textured as a result of being grown on the textured surface of the n-type layer 204. That is, growing an active layer 206 on a textured surface 204a may, in some examples, result in an active layer 206 having two textured surfaces. Therefore, when the other of the p-type layer 202 or the n-type layer 204 is grown on the textured surface of the active layer, the other of the p-type layer 202 or the n-type layer 204 will have a textured surface 202a at the interface of the other of the p-type layer 202 or the n-type layer 204 and the active layer 206. Although not illustrated, the method 400 may also include additional texturing steps performed on the active layer 206 or the other of the p-type layer 202 or the n-type layer before the layers are joined together to form the structure 200.

The resulting structure 200 may be used in an LED, as the active layer 206 may be configured to spontaneously release photons to produce light when carriers move into the active layer 206 upon the application of an electric current. Therefore, the method 400 may include additional steps not illustrated in FIG. 4. For example, the method 400 may include providing additional n-type layers or p-type layers before growing the active layer 206 and providing additional p-type layers or n-type layers after growing the active layer 206. Moreover, the method 400 may include providing metal electrodes and creating an opening in the metal electrodes to allow for the emission of light generated in the active layer 206. The method 400 may also include spontaneously creating light in the active layer 206 by electrically biasing the structure to cause a movement of carriers into the active layer 206 and emitting the light at a high rate of speed, such as above 1 GB/s.

Figure 5:
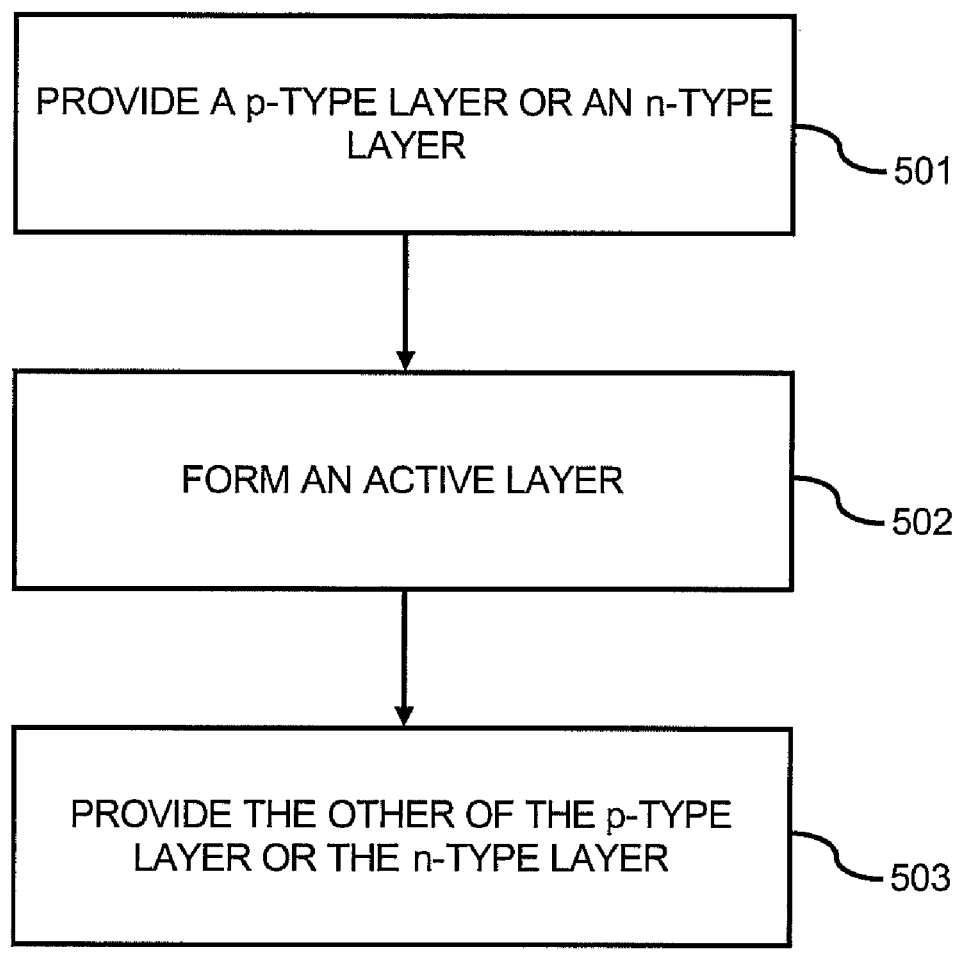
FIG. 5 illustrates a flow chart of a method for fabricating a structure comprising an active layer having at least one modulation-doped layer and at lease one quantum well.

Turning now to FIG. 5, there is shown a flow diagram of a method 500 for fabricating a structure comprising an active layer having at least one quantum well and at least one modulation-doped layer, according to an embodiment. It is to be understood that the following description of the method 500 is but one manner of a variety of different manners in which an example of the invention may be practiced. It should also be apparent to those of ordinary skill in the art that the method 500 represents a generalized illustration and that other steps may be added or existing steps may be removed, modified or rearranged without departing from a scope of the method 500.

The description of the method 500 is made with reference to the structures 100 and 100' illustrated in FIGS. 1A and 1B and thus makes reference to the elements cited therein. It should, however, be understood that the method 500 is not limited to the layers set forth in the structures 100 and 100'. Instead, it should be understood that the method 500 may be used with a structure having a different configuration than the structures 100 and 100' set forth in FIGS. 1A and 1B.

The method 500 may be initiated at step 501 where either an n-type layer or a p-type layer is provided. The n-type or p-type layer may be grown or otherwise provided on a substrate.

At step 502, an active layer 106 is formed. The active layer 106 may include at least one modulation-doped layer 108a and at least one quantum well 110a. For example, the active layer 106 may include two or more modulation-doped layers 108a and 108b and two or more quantum wells 110a and 110b arranged in an alternating configuration. At step 503, the other of the p-type layer 102 or the n-type layer 104 may be provided on the active layer 106.

The structures and method described herein may be further modified to increase the efficiency of an LED. For example, the LEDs utilizing the structures described herein may comprise a surface grating to direct light emitting from the active layer 106, 206, 306. The surface grating may include resonant grating filters (RGFs). RGFs generally include a plurality of homogenous dielectric layers combined with a grating and may exhibit an extremely narrow reflection spectral band, which would otherwise require a large number of uniform layers. Therefore, RGFs are well suited to free space filtering applications. The working principle of a reflection RGF, or guided-mode resonance filter, is that a part of the incoming light is trapped in the waveguide via evanescent grating coupling. When coupling back out, the trapped light interferes destructively with the incoming light within a very limited range of parameters, similar to a resonance condition. Outside this resonance region the light does not couple into the waveguide and is transmitted and reflected as from a regular stratified layer.

Reflection or transmission filters may also be used to form LEDs with the structures and methods described herein. In reflection filters, only a small part of the spectrum is reflected and the rest is transmitted. With reflection filters it may be easier to realize broadband transmission than broadband reflection using only a few homogenous layers. Tunability of reflection filters is based on the change of the resonance wavelength as function of the angle of incidence. Thus, by tilting the LED, the narrow reflection band can be shifted through the whole tuning range.

In other embodiments, the capacitance of the structures described herein and LEDs utilizing the structures described herein may be reduced. For example, capacitance may be reduced by reducing the overall size of the structures and the LEDs using the structures. For instance the structures may be reduced to a size of less than about 70 microns. In one example, the structures may have a size of about 10 microns. This may, in turn, reduce the RC time constant of the LEDs to further increase the modulation speed of the LEDs. The textured surfaces and the active layers described above may be utilized separately, or in conjunction with each other, to increase the efficiency of an LED. That is, the emission output of an LED may be improved with the examples described herein. For instance, the textured surface facing the active layer may increase extraction efficiency by reducing the internal reflection of the layer having the textured surface, thereby allowing light generated in the active layer to escape more efficiently.

The structure and method described herein may be used alone or in conjunction with each other and other structures, devices, and method to create a much faster and more efficient LED, as compared to conventional LEDs. For example, LEDs utilizing the structure and methods described herein my realize modulation speeds above 1, 2, and 3 Gigabyte per second (GB/s). Thus, the increased modulation speed renders the LEDs highly suitable for high speed applications, as photonic interconnects for data transmission in computing applications.

What has been described and illustrated herein are preferred examples of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims and their equivalents in which all terms are meant in their broadest reasonable sense unless otherwise indicated.

What is claimed is:

1. A light-emitting diode (LED) configured to spontaneously emit light without stimulation when electrically biased in a forward direction of an active layer, the LED comprising:
   a p-type layer;
   an n-type layer; and
   the active layer arranged between the p-type layer and the n-type layer, wherein the active layer comprises at least one quantum well adjacent to at least one modulation-doped layer, and
   a surface of at least one of the p-type layer and the n-type layer is texturized to form a textured surface having an irregular or random texture facing the active layer.

2. The LED of claim 1, further comprising:
   an electrode having an opening provided through the electrode to allow for the emission of light, wherein the light is generated spontaneously in the active layer when the LED is electrically biased to cause a movement of carriers into the active layer.

3. The LED of claim 1, wherein the active layer comprises a plurality of quantum wells and a plurality of modulation-doped layers arranged in an alternating configuration.

4. The LED of claim 1, wherein the modulation-doped layers include p-type doping.

5. The LED of claim 1, wherein the LED includes a double heterostructure.

6. The LED of claim 1, wherein the overall size of the LED is less than about 70 microns in order to reduce capacitance.

7. The LED of claim 1, wherein the LED further comprises a surface grating to direct light emitting from the active layer.

8. The LED of claim 1, wherein the surface of the at least one of the p-type layer and the n-type layer includes a surface on the p-type layer and a surface on the n-type layer having the irregular or the random texture facing the active layer.

9. The LED of claim 1, wherein the LED operates in a photonic interconnect for optically transmitting data at speeds above 1 Gigabyte per second.

10. The LED of claim 1 further comprising:
    a structure including the p-type layer, the n-type layer, and the active layer, wherein the structure has a size of less than 70 microns.

11. The LED of claim 10, wherein the size is about 10 microns.

12. A light-emitting diode (LED) comprising:
    a p-type layer having a first surface and a second surface, wherein the first surface faces an active layer;
    an n-type layer having a first surface and a second surface, wherein the first surface faces an active layer; and
    the active layer is arranged between the p-type layer and the n-type layer, wherein the first surface of at least one of the p-type layer and the n-type layer is texturized to form a textured surface having an irregular or random texture facing the active layer.

13. The LED of claim 12, wherein the first surface of the p-type layer and the first surface of the n-type layer are both texturized to form two irregularly or randomized textured surfaces facing the active layer.

14. The LED of claim 12, wherein the first surface of the p-type layer and the n-type layer are adjacent to the active layer.

15. The LED of claim 12, wherein the active layer includes a plurality of quantum wells and a plurality of modulation-doped layers arranged in an alternating configuration.

16. The LED of claim 15, wherein at least one of the plurality of modulation-doped layers include p-type doping.

17. The LED of claim 12, further comprising:
    an electrode having an opening provided through the electrode to allow for the emission of light, wherein the light is generated spontaneously in the active layer when the LED is electrically biased to cause a movement of carriers into the active layer.

18. The LED of claim 12, wherein the LED includes a double heterostructure.

19. The LED of claim 12, wherein the LED operates in a photonic interconnect for optically transmitting data at speeds above 1 Gigabyte per second.

20. The LED of claim 12 further comprising:
    a structure including the p-type layer, the n-type layer, and the active layer, wherein the structure has a size of less than 70 microns.

21. The LED of claim 20, wherein the size is about 10 microns.

* * * * *